United States Patent
Murabayashi et al.

(10) Patent No.: US 9,306,420 B2
(45) Date of Patent: Apr. 5, 2016

(54) POWER MANAGEMENT SYSTEM AND POWER MANAGEMENT METHOD

(71) Applicant: Sony Corporation, Tokyo (JP)

(72) Inventors: Noboru Murabayashi, Saitama (JP); Hiroshige Okamoto, Kanagawa (JP)

(73) Assignee: Sony Corporation (JP)

(*) Notice: Subject to any disclaimer, the term of this patent is extended or adjusted under 35 U.S.C. 154(b) by 537 days.

(21) Appl. No.: 13/749,860

(22) Filed: Jan. 25, 2013

(65) Prior Publication Data

US 2013/0200720 A1     Aug. 8, 2013

(30) Foreign Application Priority Data

Feb. 3, 2012   (JP) ................. 2012-021890

(51) Int. Cl.
  *H01F 27/42* (2006.01)
  *H02J 17/00* (2006.01)
  *G01D 4/00* (2006.01)

(52) U.S. Cl.
  CPC . *H02J 17/00* (2013.01); *G01D 4/00* (2013.01); *Y04S 20/38* (2013.01)

(58) Field of Classification Search
  CPC ........... H02J 17/00; H02J 3/14; G06N 99/005
  See application file for complete search history.

(56) References Cited

U.S. PATENT DOCUMENTS

2010/0305773 A1* 12/2010 Cohen .................. 700/296

FOREIGN PATENT DOCUMENTS

| JP | 09015279 | 1/1997 |
|---|---|---|
| JP | 2006353005 A | 12/2006 |
| JP | 2011014156 A | 1/2011 |
| JP | 2011-055623 A | 3/2011 |

OTHER PUBLICATIONS

Japanese Office Action for JP Application No. 2012021890, dated Jan. 5, 2016.

* cited by examiner

*Primary Examiner* — Jared Fureman
*Assistant Examiner* — Rafael Pacheco
(74) *Attorney, Agent, or Firm* — Lerner, David, Littenberg, Krumholz & Mentlik, LLP (57) ABSTRACT

There is provided a power management system including a detecting apparatus configured to detect electromagnetic waves generated in relation to an operation of an appliance and a receiving apparatus including an appliance determining unit configured to determine a type of the appliance based on a power spectrum of the electromagnetic waves, an operation determining unit configured to determine the operation of the appliance based on the power spectrum of the electromagnetic waves, and a power estimating unit configured to estimate power consumption of the appliance based on the type and operation of the appliance.

7 Claims, 8 Drawing Sheets

POWER MANAGEMENT SYSTEM AND POWER MANAGEMENT METHOD

CROSS-REFERENCE TO RELATED APPLICATION

The present application claims priority from Japanese Patent Application No. JP 2012-021890 filed in the Japanese Patent Office on Feb. 3, 2012, the entire content of which is incorporated herein by reference.

BACKGROUND

The present disclosure relates to a power management system and a power management method.

Recently, there has been a general demand for energy saving in ordinary households. For example, as disclosed in Japanese Patent Application Publication No. 2011-55623, cooking can be smoothly performed even when power within an ordinary household is not sufficient by controlling output power in ascending order of priority specific to a heating opening or an operation mode according to priority managed by an induction heating (IH) priority management unit.

SUMMARY

However, for example, various household electrical appliances are used in households. In the above-described related art, a process of easily visualizing power consumption in an individual household electrical appliance is not intended, and it is difficult to provide information regarding energy consumption corresponding to an operation state of an individual household electrical appliance.

There is a need to provide a user with information regarding power consumption corresponding to operations of various appliances using a simple configuration.

According to an embodiment of the present disclosure, there is provided a power management system including a detecting apparatus configured to detect electromagnetic waves generated in relation to an operation of an appliance, and a receiving apparatus including an appliance determining unit configured to determine a type of the appliance based on a power spectrum of the electromagnetic waves, an operation determining unit configured to determine the operation of the appliance based on the power spectrum of the electromagnetic waves, and a power estimating unit configured to estimate power consumption of the appliance based on the type and operation of the appliance.

Further, the receiving apparatus may include a display unit configured to display the power consumption that is estimated.

Further, the receiving apparatus may acquire information regarding the electromagnetic waves from the detecting apparatus through wireless or wired communication.

Further, the electromagnetic waves generated in relation to the operation of the appliance may be electromagnetic waves generated by an electronic circuit of the appliance.

Further, the electromagnetic waves generated in relation to the operation of the appliance may be electromagnetic waves generated by a remote controller that operates the appliance.

Further, the receiving apparatus may include a detecting unit configured to analyze the spectrum of the electromagnetic waves.

Further, the appliance determining unit may analyze the spectrum of the electromagnetic waves.

Further, according to an embodiment of the present disclosure, there is provided a power management method including detecting electromagnetic waves generated in relation to an operation of an appliance, determining a type of the appliance based on a power spectrum of the electromagnetic waves, determining the operation of the appliance based on the electromagnetic waves, and estimating power consumption of the appliance based on the type and operation of the appliance.

In accordance with the embodiments of the present disclosure described above, it is possible to provide a user with information regarding power consumption corresponding to operations of various appliances using a simple configuration.

DETAILED DESCRIPTION OF THE EMBODIMENT(S)

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Description will be given in the following order.

1. First Embodiment
 1.1. Schematic Configuration of System in Accordance with First Embodiment
 1.2. Configuration Example of Receiving Apparatus
 1.3. Example of Power Spectrum of Electromagnetic Waves
 1.4. Processing Procedure in System of First Embodiment
 1.5. Example of Display in Display Unit of Receiving Apparatus
2. Second Embodiment
 2.1. Schematic Configuration of System in Accordance with Second Embodiment
3. Third Embodiment
 3.1. Schematic Configuration of System in Accordance with Third Embodiment 3.2. Processing Procedure of Processing Apparatus in Third Embodiment

1. First Embodiment

1.1. Schematic Configuration of System in Accordance with First Embodiment

Figure 1:
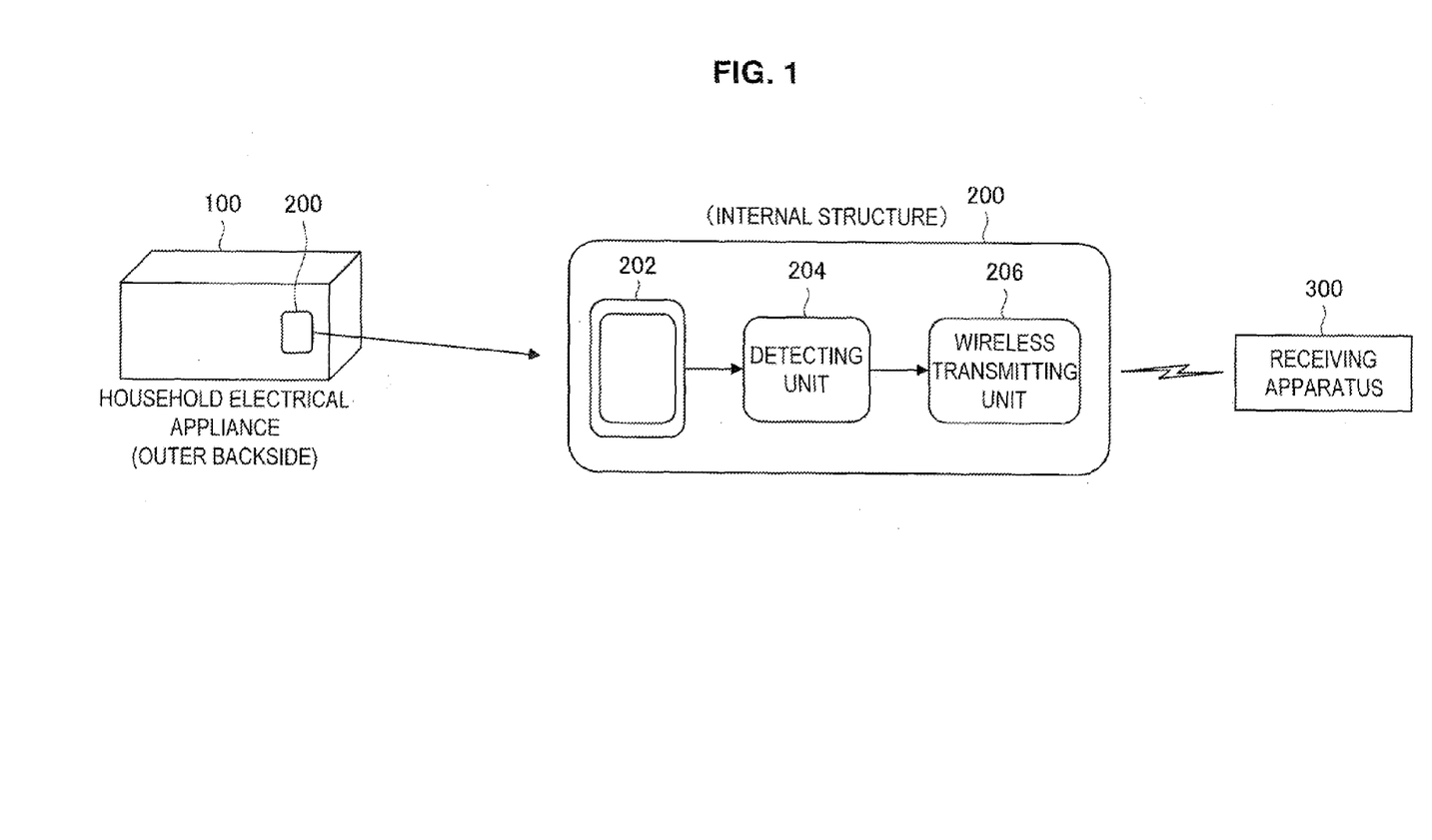
FIG. 1 is a schematic diagram illustrating a schematic configuration of a system in accordance with a first embodiment of the present disclosure.

First, the schematic configuration of the system in accordance with the first embodiment of the present disclosure will be described with reference to FIG. 1. In this embodiment, unique electromagnetic noise (noise: hereinafter referred to as a unique signal) occurring due to an operation of an electronic circuit of household electrical appliance is detected. As illustrated in FIG. 1, the system of this embodiment includes a household electrical appliance 100, a detecting apparatus 200, and a receiving apparatus 300. The detecting apparatus 200 is mounted on the back of the household electrical appliance 100. The detecting apparatus 200 detects electromagnetic waves of the household electrical appliance 100, and transmits information regarding the electromagnetic waves to the receiving apparatus 300. The receiving apparatus 300 discriminates a type, an operation mode, and the like of the household electrical appliance 100 based on the information regarding the received electromagnetic waves, and provides a user with information regarding an operation of the household electrical appliance 100, particularly, information regarding power consumption.

As illustrated in FIG. 1, the detecting apparatus 200 includes a loop antenna 202, a detecting unit 204, and a wireless transmitting unit 206. The loop antenna 202 receives a signal (unique signal) of electromagnetic waves generated by the household electrical appliance 100 and transmits the received signal to the detecting unit 204. The electromagnetic waves are detected by the detecting unit 204, and predetermined spectrum analysis is performed. Analysis data (a power spectrum) is transmitted to the receiving apparatus 300 according to wireless transmission from the wireless transmitting unit 206.

A spectrum of a unique signal generated from the household electrical appliance differs according to a household electrical appliance and an operation mode. For example, an air conditioner usually generates a spectrum of a low-frequency component according to an operation of a compressor, and the spectrum also changes when the operation mode changes for a large air volume or the like. On the other hand, a television receiver or the like usually generates a spectrum of a high-frequency component by processing a video signal. Accordingly, it is possible to determine a model and mode of the household electrical appliance 100 based on a spectrum of a unique signal. As described above, it is possible to discriminate a type of the household electrical appliance 100 and an operation mode of the household electrical appliance 100 by detecting a unique signal generated from the household electrical appliance 100 and performing spectrum analysis.

1.2. Configuration Example of Receiving Apparatus

Figure 2:
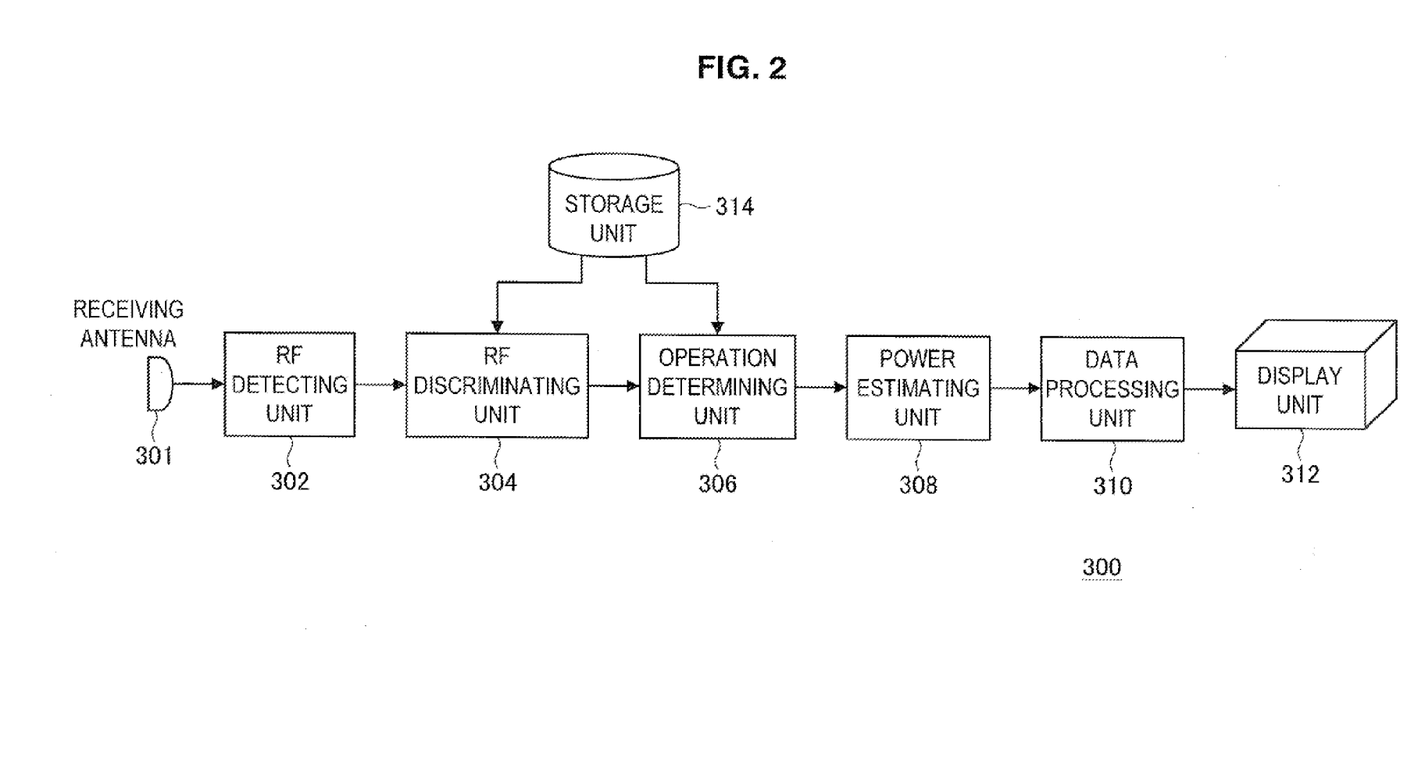
FIG. 2 is a schematic diagram illustrating a configuration example of a receiving apparatus.

FIG. 2 is a schematic diagram illustrating the configuration example of the receiving apparatus 300. The receiving apparatus 300 includes a receiving antenna 301, an RF (electromagnetic wave) detecting unit 302, an RF discriminating unit (appliance determining unit) 304, an operation determining unit 306, a power estimating unit 308, a data processing unit 310, a display unit 312, and a storage unit 314. The RF detecting unit 302 acquires information regarding electromagnetic waves transmitted from the detecting apparatus 200 via the receiving antenna 301. Here, although a power spectrum transmitted from the detecting apparatus 200 is acquired, spectrum analysis may be performed at the side of the receiving apparatus 300. In this case, the RF discriminating unit 304 can perform the spectrum analysis. The RF discriminating unit 304 discriminates electromagnetic waves based on a power spectrum of the electromagnetic waves, and discriminates a model of the household electrical appliance 100. The operation determining unit 306 determines an operation mode of the household electrical appliance 100 based on the power spectrum of the electromagnetic waves. The power estimating unit 308 estimates power consumption of the household electrical appliance 100 based on the model and operation mode of the household electrical appliance 100. The data processing unit 310 processes data of the estimated power consumption and performs a predetermined statistical process such as an averaging process for each time. The display unit 312 displays data processed by the data processing unit 310.

The structural elements illustrated in FIG. 2 can be configured by a circuit (hardware) or a central processing apparatus such as a central processing unit (CPU), and a program (software) for causing the circuit (hardware) or the central processing apparatus to function. In this case, the program can be stored in a memory such as the storage unit 314 provided in the receiving apparatus 300 or an external storage medium connected from an outside, and downloaded via a network such as the Internet.

1.3. Example of Power Spectrum of Electromagnetic Waves

Figure 3:
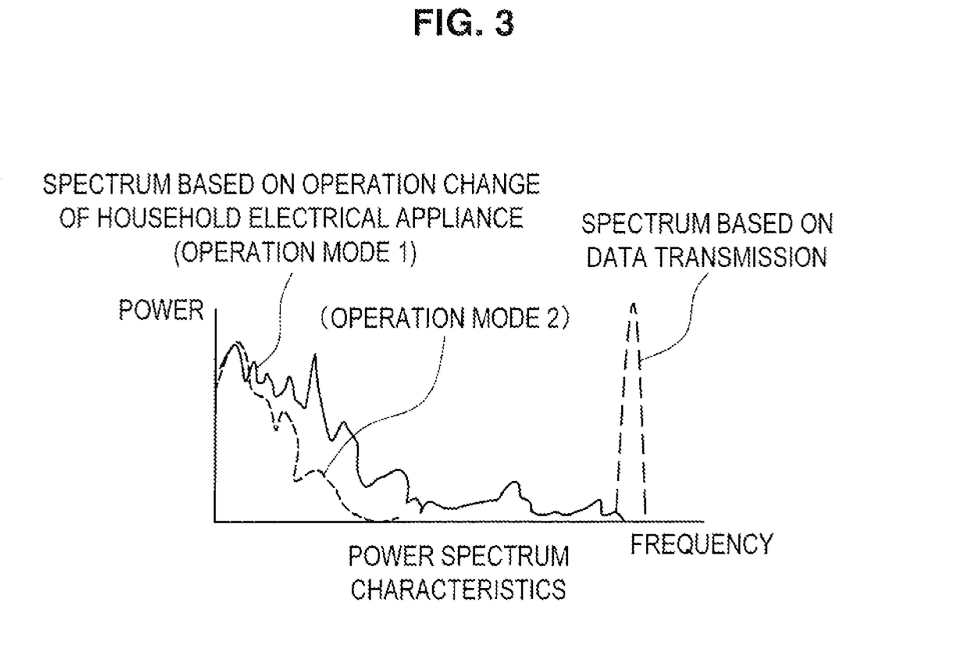
FIG. 3 is a characteristic diagram illustrating an example of a power spectrum of electromagnetic waves detected in a radio frequency (RF) detecting unit.

FIG. 3 is a characteristic diagram illustrating an example of the power spectrum of the electromagnetic waves detected in the RF detecting unit 302. In FIG. 3, power spectra of operation modes 1 and 2 for the same household electrical appliance 100 are illustrated. A power spectrum of electromagnetic waves differs according to a model of the household electrical appliance 100. Thus, it is possible to determine the model of the household electrical appliance 100 based on power-spectrum characteristics. In addition, as illustrated in FIG. 3, the power spectrum of the electromagnetic waves differs according to the operation mode even in the same household electrical appliance 100. Thus, it is possible to determine the operation mode of the household electrical appliance 100 based on the power-spectrum characteristics. As described above, it is possible to discriminate the model and operation mode of the household electrical appliance 100 based on the power spectrum of the electromagnetic waves.

Thus, the storage unit 314 of the receiving apparatus 300 pre-stores a power spectrum for each model of the household electrical appliance 100 and a power spectrum for each operation mode of each model. The RF discriminating unit 304 determines the model of the household electrical appliance 100 by comparing the power spectrum detected by the RF detecting unit 302 with the power spectrum stored in the storage unit 314. In addition, the operation determining unit 306 determines the operation mode of the household electrical appliance 100 by comparing the power spectrum detected by the RF detecting unit 302 with the power spectrum stored in the storage unit 314.

1.4. Processing Procedure in System of First Embodiment

Figure 4:
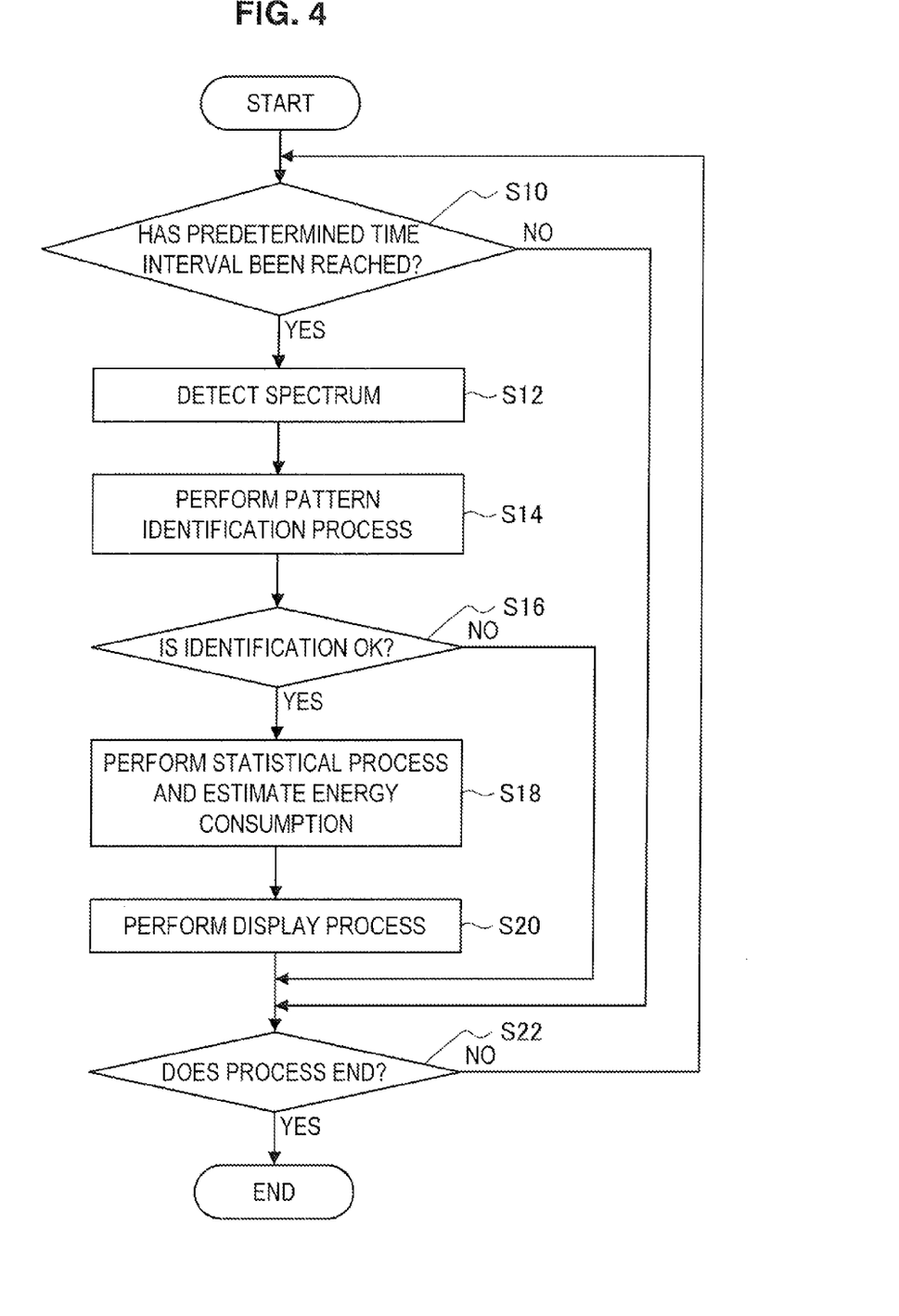
FIG. 4 is a flowchart illustrating a processing procedure in the system of the first embodiment.

Next, the processing procedure in the system of this embodiment will be described based on FIG. 4. First, in step S10, it is determined whether or not a predetermined time interval (for example, an interval of 5 minutes) has been reached. When the predetermined time interval has been reached, the process proceeds to step S12. On the other hand, when the predetermined time interval has not been reached, the process proceeds to step S22. In step S12, the RF detecting unit 302 detects a power spectrum.

In the next step S14, a pattern identification process on the detected power spectrum is performed. As a pattern identification technique, a machine learning technique such as a support vector machine (SVM) or a neural network can be used. An attribute of unknown data is discriminated from original previously learned data. The original data learned during the pattern identification is stored in the storage unit 314. As the pattern identification result, a type and operation of the household electrical appliance 100 are determined. At this time, according to the pattern identification, the type and operation of the household electrical appliance 100 are determined from a pattern of detected spectrum data. In the next step S16, it is discriminated whether or not the identification has been performed normally. When the identification has been performed normally, the process proceeds to step S18. On the other hand, when the identification has not been performed normally, the process proceeds to step S22 because the detected spectrum is likely to be some kind of noise or the like.

Because the power spectrum varies with the passage of time, a statistical process is performed to average integrated values of power spectra, and average energy consumption is calculated for every predetermined period of time at a predetermined time. The statistical process may be other statistical process such as a process of calculating a variance value of a power spectrum. In addition, in step S18, a process of discriminating the model and operation mode of the household electrical appliance 100 and estimating energy consumption based on the result of the statistical process is performed.

Next, in step S20, the display unit 312 performs a display based on the result of the estimation of step S18. In the next step S22, it is determined whether or not the process ends. When the process ends, the process of FIG. 4 ends. On the other hand, when the process does not end, the process returns to step S10, and the subsequent process is performed.

1.5. Example of Display in Display Unit of Receiving Apparatus

Figure 5:
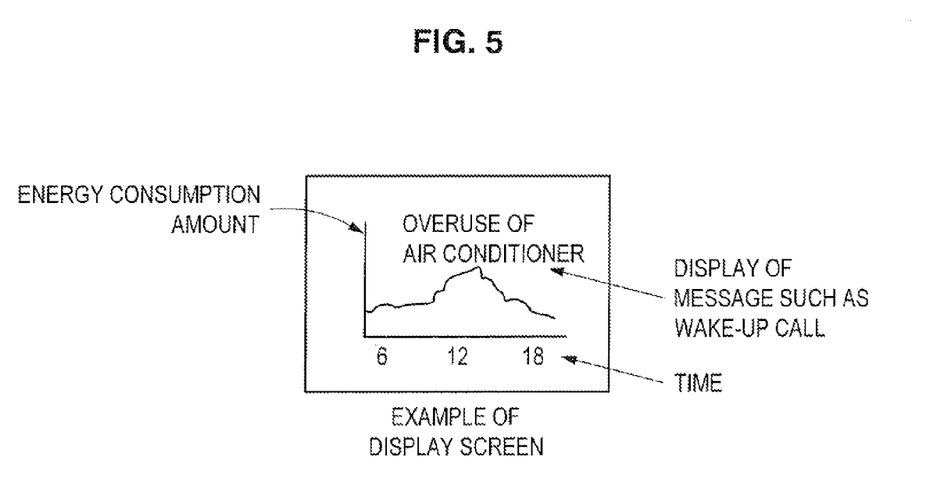
FIG. 5 is a schematic diagram illustrating an example of a display in a display unit of the receiving apparatus.

FIG. 5 is a schematic diagram illustrating the example of the display in the display unit 312 of the receiving apparatus 300. As illustrated in FIG. 5, power consumption (energy consumption) is calculated according to a model and operation mode of the household electrical appliance 100 and displayed on the display unit 312. In the example of FIG. 5, a form in which the energy consumption varies with the passage of time is illustrated. It is possible to visually display energy consumption and arouse interest in energy saving among users by displaying the energy consumption within a predetermined period of time at each time. In addition to the case in which the receiving apparatus 300 itself performs the display, display information can also be transmitted to a television receiver or a portable phone and displayed thereon. In addition, in the example of FIG. 5, because power consumption exceeds a predetermined threshold value, a message indicating "overuse of air conditioner" is displayed. Thereby, the user viewing the display unit 312 can achieve energy saving by decreasing a temperature setting of the air conditioner.

In accordance with the first embodiment as described above, it is possible to determine the model and operation mode of the household electrical appliance 100 based on electromagnetic waves emitted from the household electrical appliance 100. It is possible to allow the user to recognize information regarding power consumption and achieve energy saving by displaying power consumption estimated according to the model and operation mode of the household electrical appliance 100. Accordingly, it is possible to easily manage power within the household because a working situation of individual household electrical appliance within a household can be known and an ineffective operation can be reduced.

2. Second Embodiment

Figure 6:
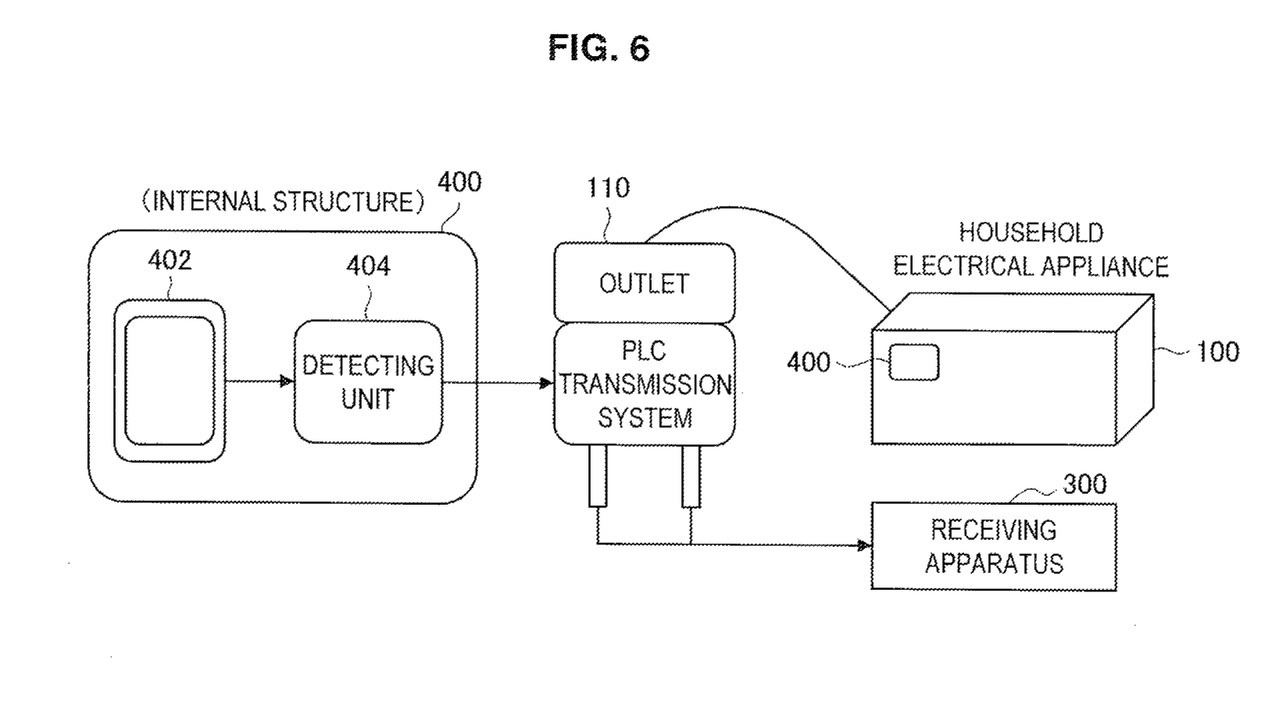
FIG. 6 is a schematic diagram illustrating a schematic configuration of a system in accordance with a second embodiment.

2.1. Schematic Configuration of System in Accordance with Second Embodiment Next, the second embodiment of the present disclosure will be described. FIG. 6 is a schematic diagram illustrating the schematic configuration of the system in accordance with the second embodiment. As illustrated in FIG. 6, the system of the second embodiment also includes a household electrical appliance 100, a detecting apparatus 400, and a receiving apparatus 300. As in the first embodiment, the detecting apparatus 400 is mounted on the back of the household electrical appliance 100. In the second embodiment, the detecting apparatus 400 mounted on the household electrical appliance 100 delivers information regarding electromagnetic waves to the receiving apparatus 300 by cable. At this time, the detecting apparatus 400 transmits the information regarding the electromagnetic waves to the receiving apparatus 300 through a power line communications (PLC) system having a structure integrated with an outlet (power plug) 110 of the household electrical appliance 100.

As illustrated in FIG. 6, the detecting apparatus 400 includes a loop antenna 402 and a detecting unit 404. The loop antenna 402 transmits a signal of electromagnetic waves generated by the household electrical appliance 100 to the detecting unit 404, and the detecting unit 404 detects the electromagnetic waves. The detected electromagnetic waves are transmitted from the outlet 110 of the household electrical appliance 100 to the receiving apparatus 300 through PLC transmission.

Although the configuration of the receiving apparatus 300 is substantially the same as in the first embodiment described with reference to FIG. 3, no receiving antenna 301 is provided because the information regarding the electromagnetic waves is transmitted by cable in the second embodiment. As in the first embodiment, the receiving apparatus 300 determines a model and operation mode of the household electrical appliance 100 based on a power spectrum of the electromagnetic waves, and displays power consumption.

In accordance with the second embodiment as described above, it is possible to determine the model and operation mode of the household electrical appliance 100 based on the electromagnetic waves emitted from the household electrical appliance 100 by transmitting the information regarding the electromagnetic waves from the detecting apparatus 400 to the receiving apparatus 300 by cable. It is possible to allow the user to recognize information regarding power consumption and achieve energy saving by displaying the power consumption estimated according to the model and operation mode of the household electrical appliance 100.

3. Third Embodiment

3.1. Schematic Configuration of System in Accordance with Third Embodiment

Figure 7:
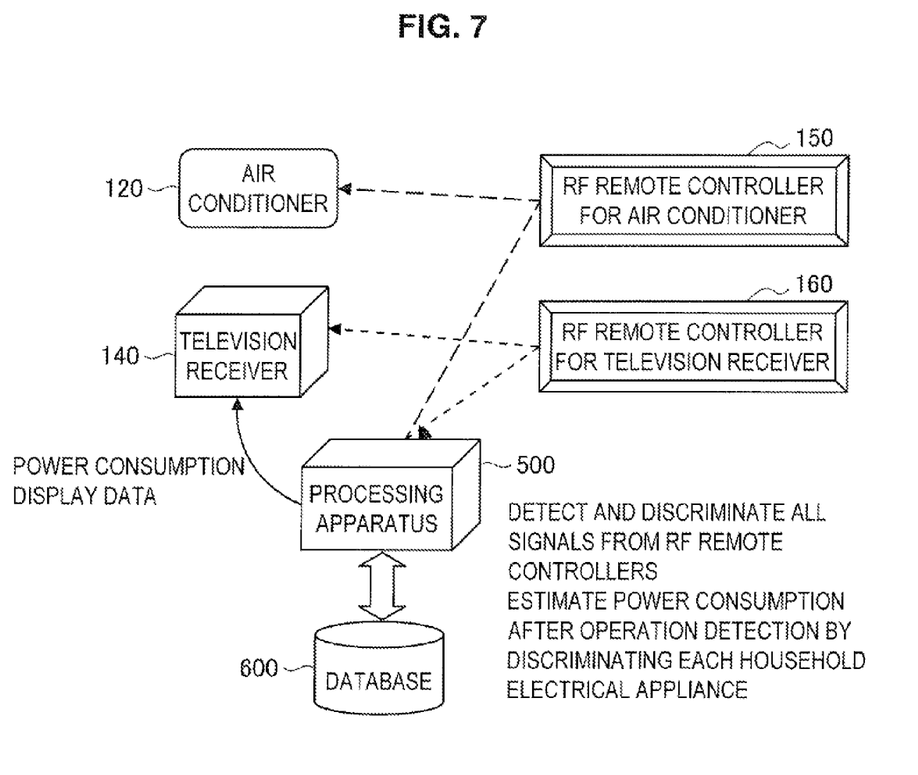
FIG. 7 is a schematic diagram illustrating a schematic configuration of a system in accordance with a third embodiment.

Next, the third embodiment of the present disclosure will be described. FIG. 7 is a schematic diagram illustrating the schematic configuration of the system in accordance with the third embodiment. As illustrated in FIG. 7, the system of the third embodiment has an air conditioner 120 and a television receiver 140 as household electrical appliances. In addition, the system of the third embodiment has an RF remote controller 150 for the air conditioner 120 for operating the air conditioner 120, an RF remote controller 160 for the television receiver 140 for operating the television receiver 140, a processing apparatus 500, and a database 600.

The RF remote controller 150 for the air conditioner 120 and the RF remote controller 160 for the television receiver 140 cause the air conditioner 120 and the television receiver 140 to operate according to an operation of the user by transmitting electromagnetic waves corresponding to the user's operation to the air conditioner 120 and the television receiver 140.

The processing apparatus 500 has substantially the same configuration as the receiving apparatus 300 of the first embodiment, receives electromagnetic waves transmitted by the RF remote controller 150 for the air conditioner 120 and the RF remote controller 160 for the television receiver 140, determines whether or not each of the air conditioner 120 and the television receiver 140 is in operation based on a power spectrum of the electromagnetic waves, and also determines its operation mode. In the third embodiment, energy consumption of each household electrical appliance is estimated based on the determination result and information regarding the energy consumption is provided to the user.

3.2. Processing Procedure of Processing Apparatus in Third Embodiment

Figure 8:
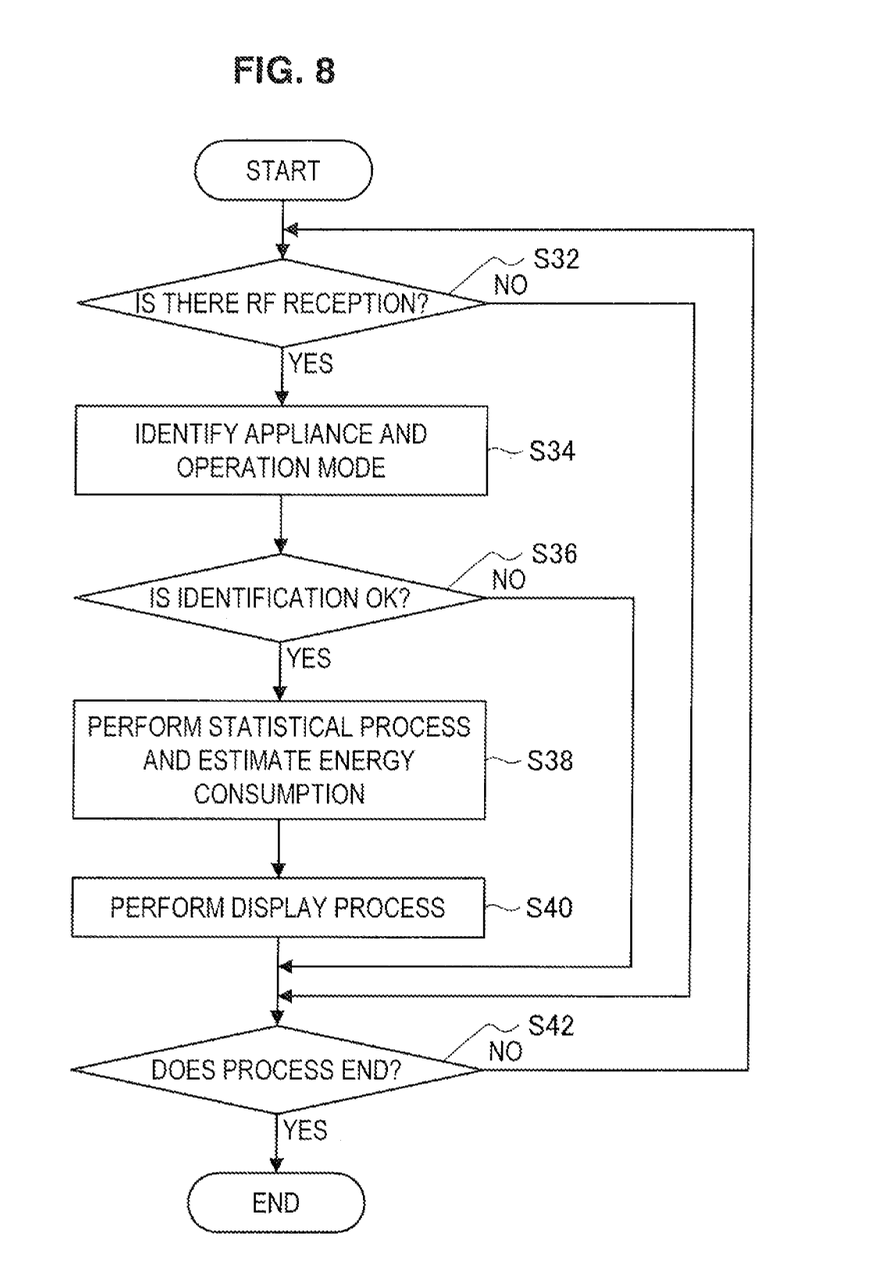
FIG. 8 is a flowchart illustrating a processing procedure of a processing apparatus in the third embodiment.

FIG. 8 is a flowchart illustrating the processing procedure of the processing apparatus 500 in the third embodiment. First, in step S32, it is determined whether or not electromagnetic waves transmitted by the RF remote controller 150 for the air conditioner 120 and the RF remote controller 160 for the television receiver 140 have been received. When the electromagnetic waves have been received, the process proceeds to step S34. When the electromagnetic waves have not been received, the process proceeds to step S42.

In step S34, the household electrical appliance in operation and its operation mode are identified based on the received electromagnetic waves. In the next step S36, it is determined whether or not the household electrical appliance and the operation mode have been identified normally. When the identification has been performed normally, the process proceeds to step S38.

Because the power spectrum varies with the passage of time, a statistical process of averaging integrated values of power spectra is performed in step S38. In addition, in step S38, a process of estimating energy consumption is performed based on the result of the statistical process.

Next, in step S40, the display unit 312 performs a display based on the result of the estimation of step S38. In the next step S42, it is determined whether or not the process ends. When the process ends, the process of FIG. 8 ends. On the other hand, when the process does not end, the process returns to step S32, and the subsequent process is performed.

In accordance with the third embodiment as described above, it is possible to determine the operation modes of the air conditioner 120 and the television receiver 140 based on electromagnetic waves emitted by the RF remote controller 150 for the air conditioner 120 and the RF remote controller 160 for the television receiver 140. It is possible to allow the user to recognize information regarding power consumption and achieve energy saving by displaying power consumption estimated according to the operation modes of the air conditioner 120 and the television receiver 140.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A power management system including:
a detecting apparatus configured to detect electromagnetic waves generated in relation to an operation of an appliance; and
a receiving apparatus including an appliance determining unit configured to determine a type of the appliance based on a power spectrum of the electromagnetic waves, an operation determining unit configured to determine the operation of the appliance based on the power spectrum of the electromagnetic waves, and a power estimating unit configured to estimate power consumption of the appliance based on the type and operation of the appliance.

(2) The power management system according to (1), wherein the receiving apparatus includes a display unit configured to display the power consumption that is estimated.

(3) The power management system according to (1), wherein the receiving apparatus acquires information regarding the electromagnetic waves from the detecting apparatus through wireless or wired communication.

(4) The power management system according to (1), wherein the electromagnetic waves generated in relation to the operation of the appliance are electromagnetic waves generated by an electronic circuit of the appliance.

(5) The power management system according to (1), wherein the electromagnetic waves generated in relation to the operation of the appliance are electromagnetic waves generated by a remote controller that operates the appliance.

(6) The power management system according to (1), wherein the receiving apparatus includes a detecting unit configured to analyze the spectrum of the electromagnetic waves.

(7) The power management system according to (1), wherein the appliance determining unit analyzes the spectrum of the electromagnetic waves.

(8) A power management method including:
detecting electromagnetic waves generated in relation to an operation of an appliance;
determining a type of the appliance based on a power spectrum of the electromagnetic waves;
determining the operation of the appliance based on the electromagnetic waves; and
estimating power consumption of the appliance based on the type and operation of the appliance.

What is claimed is:
1. A power management system comprising:
a detecting apparatus having an antenna and a detecting unit, said antenna configured to wirelessly receive an electromagnetic signal emitted from an appliance during an operation thereof and said detecting unit configured to detect electromagnetic waves from the received electromagnetic signal; and a receiving apparatus including an appliance determining unit configured to determine a type of the appliance based on a power spectrum of the electromagnetic waves, an operation determining unit configured to determine the operation of the appliance based on the power spectrum of the electromagnetic waves, and a power estimating unit configured to estimate power consumption of the appliance based on the type and operation of the appliance.

2. The power management system according to claim 1, wherein the receiving apparatus includes a display unit configured to display the power consumption that is estimated.

3. The power management system according to claim 1, wherein the receiving apparatus acquires information regarding the electromagnetic waves from the detecting apparatus through wireless or wired communication.

4. The power management system according to claim 1, wherein the detected electromagnetic waves are electromagnetic waves generated by an electronic circuit of the appliance.

5. The power management system according to claim 1, wherein the detected electromagnetic waves are electromagnetic waves generated by a remote controller that operates the appliance.

6. The power management system according to claim 1, wherein the appliance determining unit analyzes the spectrum of the electromagnetic waves.

7. A power management method comprising:

wirelessly receiving an electromagnetic signal emitted from an appliance during an operation thereof and detecting electromagnetic waves from the received electromagnetic signal;

determining a type of the appliance based on a power spectrum of the electromagnetic waves;

determining the operation of the appliance based on the electromagnetic waves; and estimating power consumption of the appliance based on the type and operation of the appliance.

* * * * *